(12) United States Patent
Tanemura et al.

(10) Patent No.: US 6,292,063 B1
(45) Date of Patent: Sep. 18, 2001

(54) OSCILLATING APPARATUS INCLUDING TWO-BAND RESONANCE CIRCUIT

(75) Inventors: Takeshi Tanemura; Yasuhiro Ikarashi, both of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/634,516

(22) Filed: Aug. 8, 2000

(30) Foreign Application Priority Data

Aug. 19, 1999 (JP) .................................................. 11-232598

(51) Int. Cl.$^7$ ................................ H03B 5/08; H03B 5/12
(52) U.S. Cl. ................... 331/49; 331/48; 331/77; 331/117 R; 331/175; 331/177 V
(58) Field of Search .................... 331/36 C, 48, 331/49, 74, 77, 117 R, 117 FE, 117 D, 96, 175, 173, 177 V, 179

(56) References Cited

U.S. PATENT DOCUMENTS 5,852,384 * 12/1998 Sakakura et al. ...................... 331/48

FOREIGN PATENT DOCUMENTS

| 0 886 384 A | 12/1998 | (EP) . |
| 1002941 | 9/1965 | (GB) . |
| 9-294018 | 9/1997 | (JP) . |
| 11-298242 | 11/1999 | (JP) . |

* cited by examiner

*Primary Examiner*—David Mis
(74) *Attorney, Agent, or Firm*—Brinks Hofer Gilson & Lione

(57) ABSTRACT

The two-band oscillating apparatus of the present invention comprises in one aspect a first oscillator for outputting an oscillation signal of a first frequency band, a second oscillator for outputting an oscillation signal of a second frequency band which is higher than the first frequency band, and a grounded-emitter type amplifier including an amplifying transistor to amplify the oscillation signal of the first frequency band or the oscillation signal of the second frequency band. In this structure, an emitter bias resistor is connected between the emitter of the amplifying transistor and the ground. A first series resonance device which resonates in almost the first frequency band, and a second series resonance device which resonates in almost second frequency band, are connected between the emitter and ground. Thereby, the number of parts can be reduced through simplified structure. The amplification degree may be increased within two oscillation frequency bands without changing the amplifying characteristic.

5 Claims, 2 Drawing Sheets

OSCILLATING APPARATUS INCLUDING TWO-BAND RESONANCE CIRCUIT

BACKGROUND OF THE INVENTION

1. Field of the Invention

The present invention relates to a two-band oscillation apparatus to be used in a hand-held telephone set used in common for different two systems.

2. Description of the Related Art

FIG. 3 illustrates a structure of a two-band oscillation apparatus of the related art consisting of a first oscillator 21, a second oscillator 22 and an amplifier 23. The first oscillator 21 is structured to oscillate at a low frequency band (Lf) of about 880 MHz to 940 MHz. The second oscillator 22 is structured to oscillate at a high frequency band (Hf) of about 1805 MHz to 1920 MHz which is higher than the oscillation frequency of the first oscillator 21.

The power source voltage (Vb) is applied to the first oscillator 21 or second oscillator 22 through a first change-over switch 24. The oscillator to which the power source voltage is applied operates to output an oscillation signal. An amplifier 23 amplifies such oscillation signal.

The amplifier 23 is formed as an emitter-grounded tuning amplifier. The power source voltage is impressed to the collector of the amplifying transistor 23a via a choke inductor 23b. The emitter of amplifying transistor is grounded through a bias resistor 23c and a bypass capacitor 23d. Moreover, a series circuit of a tuning capacitor 23e and a switching diode 23f is connected between the collector and ground. The cathode of switching diode 23f is grounded and a switching voltage (Vs) is impressed to the anode thereof via a second change-over switch 25. The second change-over switch 25 is changed over in conjunction with the first change-over switch 24.

When the power source voltage is impressed to the first oscillator 21 with the first change-over switch 24, a switching voltage is impressed to the anode of the switching diode 23f of the amplifier 23 via the second change-over switch 25 to turn ON the switching diode 23f. An oscillation signal of the low frequency band output from the first oscillator 21 is input to the amplifier 23. In the amplifier 23, a parallel tuning circuit is formed of a choke inductor 23b and a tuning capacitor 23e when the switching diode 23f turns ON. The tuning frequency is set almost to be matched with the low frequency band. Therefore, the amplifying characteristic of the amplifier 23 shows the peak amplification degree in the low frequency band as illustrated in A of FIG. 4. The oscillation signal of the low frequency band input to the amplifier 23 is amplified to a large extent. The amplified oscillation signal is output from the collector of amplifying transistor 23a via a DC-cut capacitor 23h.

Conversely, when the power source voltage is impressed to the second oscillator 22 with the first change-over switch 24, a change-over voltage is no longer impressed to the anode of the switching diode 23f of amplifier 23 with the second change-over switch 25 to turn OFF the switching diode 23f. An oscillation signal of the high frequency band output from the second oscillator 22 is then input to the amplifier 23. In the amplifier 23, when the switching diode 23f turns OFF, its terminal capacitance is connected in series to the tuning capacitor 23e. The combining capacitance of these elements is connected in parallel to the choke inductor 23b to form a parallel tuning circuit. The tuning frequency is set almost to be matched with the high frequency band. Therefore, the amplifying characteristic of the amplifier 23 has the peak amplification degree in the high frequency band as illustrated in B of FIG. 4. The oscillation signal of high frequency band input to the amplifier 23 is amplified to a large extent. The amplified oscillation signal is output from the collector of amplifying transistor 23a via the DC-cut capacitor 23h.

As explained above, the two-band oscillating apparatus of the related art forms an amplifier to amplify the oscillating signal of two frequency bands with a tuning amplifier. Moreover the tuning frequency of the tuning circuit of the tuning amplifier is changed over. Therefore, a large number of parts are required to impede reduction in size of the circuit.

SUMMARY OF THE INVENTION

Therefore, it is an object of the invention to provide a two-band oscillator which reduces the number of parts by simplifying the structure of amplifier and assures the higher amplification degree in two oscillation frequencies without changing-over of the amplifying characteristic.

As a means for overcoming the problems explained above, the two-band oscillation apparatus of the present invention comprises a first oscillator for outputting the oscillation signal of the first frequency band, a second oscillator for outputting the oscillation signal of the second frequency band higher than the first frequency band, and an emitter-grounded amplifier including an amplifying transistor to amplify the oscillation signal of the first frequency band or the oscillation signal of the second frequency band with the amplifying transistor. A bias resistor is connected between the emitter of the amplifying transistor and the ground. Moreover a first series resonance means having the series resonance frequency in the first frequency band and a second series resonance means having the series resonance frequency in the second frequency band are connected between the emitter and the ground.

Moreover, the two-band oscillating apparatus of the present invention uses a first capacitance element having the self series resonance frequency in the first frequency band as the first series resonance means and a second capacitance element having the self series resonance frequency in the second frequency band as the second series resonance means.

Moreover, the two-band oscillating apparatus of the present invention uses a first chip capacitor as the first capacitance element, while a second chip capacitor as the second capacitance element.

Moreover, the two-band oscillating apparatus of the present invention structures the first series resonance means with a first capacitance means and a first inductance means, and the second series resonance means with a second capacitance means and a second inductance means.

In addition, the two-band oscillating apparatus of the present invention also comprises a first conductor to connect the first capacitance means between the emitter and the ground and a second conductor to connect the second capacitance means between the emitter and the ground and defines the first conductor as the first inductance means and the second conductor as the second inductance means.

DETAILED DESCRIPTION OF THE PREFERRED EMBODIMENT

Figure 1:
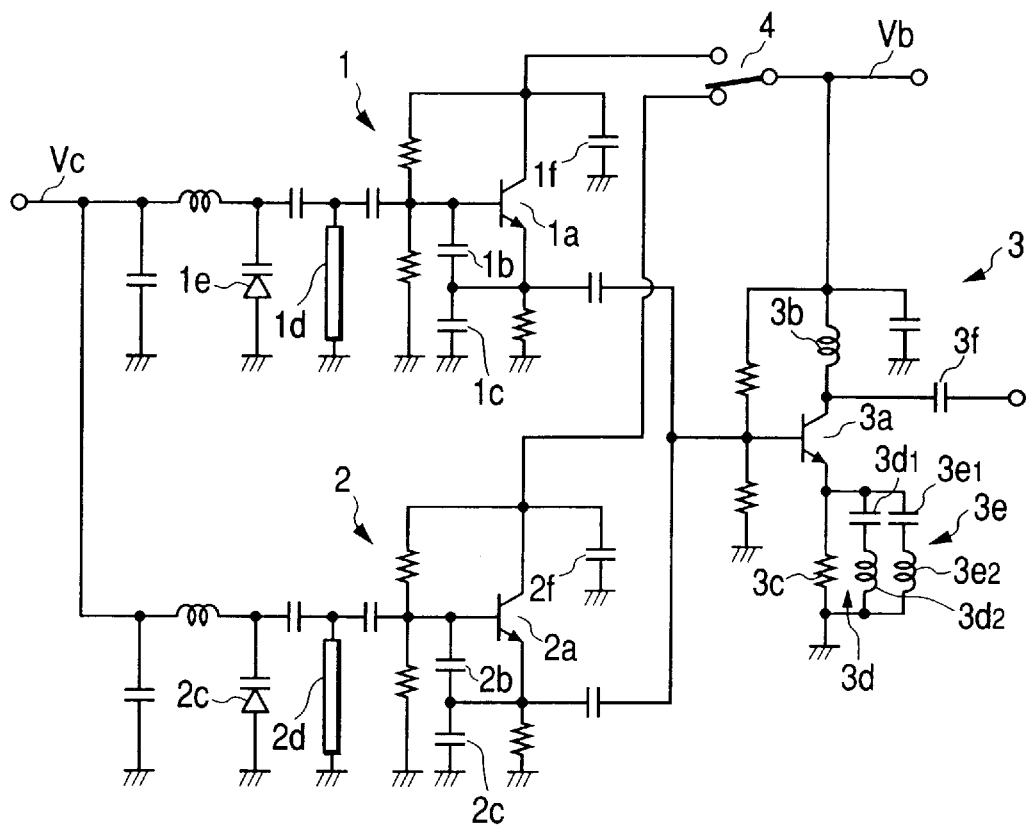
FIG. 1 is a structural diagram of a two-band oscillating according to the embodiment of the present invention.

FIG. 1 illustrates a structure of the two-band oscillating apparatus of an embodiment according to the present invention, consisting of a first oscillator 1, a second oscillator 2 and anamplifier 3. The first oscillator 1 outputs an oscillation signal of the first frequency band (Lf) of the frequency as low as 880 MHz to 940 MHz, while the second oscillator 2 outputs an oscillation signal of the second frequency band (Hf) of 1805 MHz to 1920 MHz, which is higher than the first frequency band. These oscillators are structured as the grounded-collector type voltage controlled oscillator.

That is, the first oscillator 1 is formed of a first oscillation transistor 1a, first feedback capacitors 1b, 1c, a first resonance line 1d, and a first varactor diode 1e. The collector of the first oscillation transistor 1a is grounded in the high frequency manner through the first grounding capacitor 1f. The oscillation frequency of the first frequency band changes depending on the control voltage Vc impressed to the first varactor diode 1e. The oscillation signal can be extracted from the emitter.

The second oscillator 2 is similarly formed of a second oscillation transistor 2a, second feedback capacitors 2b, 2c, a second resonance line 2d and a second varactor diode 2e. The collector of the second oscillation transistor 2a is grounded in the high frequency manner through the second grounding capacitor 2f. The oscillation frequency of the second frequency band changes depending on the control voltage Vc impressed to the second varactor diode 2e and the oscillation signal can be extracted from the emitter.

The power source voltage (Vb) is applied, through the change-over switch 4, to any one of the collector of the first oscillation transistor 1a and the collector of the second oscillation transistor 2a. The oscillator to which such power source voltage (Vb) is applied operates to output the oscillation signal.

The amplifier 3 is formed as a grounded-emitter type amplifier in which the power source voltage is applied to the collector of the amplifying transistor 3a via the choke inductor 3b. The emitter is grounded through a bias resistor 3c. Moreover, a first series resonance device 3d and a second series resonance device 3e are connected in parallel between the emitter and ground.

The first series resonance device 3d includes the serially connected first capacitance element 3d1 and the first inductance element 3d2 and is set to have the series resonance frequency almost in the first frequency band. In the same manner, the second series resonance device 3e includes the serially connected second capacitance element 3e1 and the second inductance element 3e2 and is set to have the series resonance frequency almost in the second frequency band.

As the first series resonance device 3d and second series resonance device 3e, any type of device having the series resonance frequency in the first frequency band and the second frequency band can be used. For instance, since a so-called chip capacitor which is a leadless type capacitance element has the self series resonance frequency from its structural viewpoint, the first capacitance element such as the first chip capacitor having the self series resonance frequency in the first frequency band may be used as the first series resonance device 3d. The second capacitance element such as the second chip capacitor having the self series resonance frequency in the second frequency band may be used as the second series resonance device 3e.

Moreover, it is also possible that the first series resonance device 3d is formed of a first capacitance device having the same capacitance as that of the first capacitance element 3d1 and the first inductance device having the same inductance as that of the first inductance element 3d2. The second series resonance device 3e is formed of a second capacitance device having the same capacitance as that of the second capacitance element 3e1 and a second inductance device having the same inductance as that of the second inductance element 3e2.

Moreover, it is also possible that the first inductance device is formed of a first conductor to connect the first capacitance means between the emitter of the amplifying transistor 3a and the ground. The second inductance device may be formed of a second conductor to connect the second capacitance device between the emitter of the amplifying transistor 3a and the ground.

Figure 2:
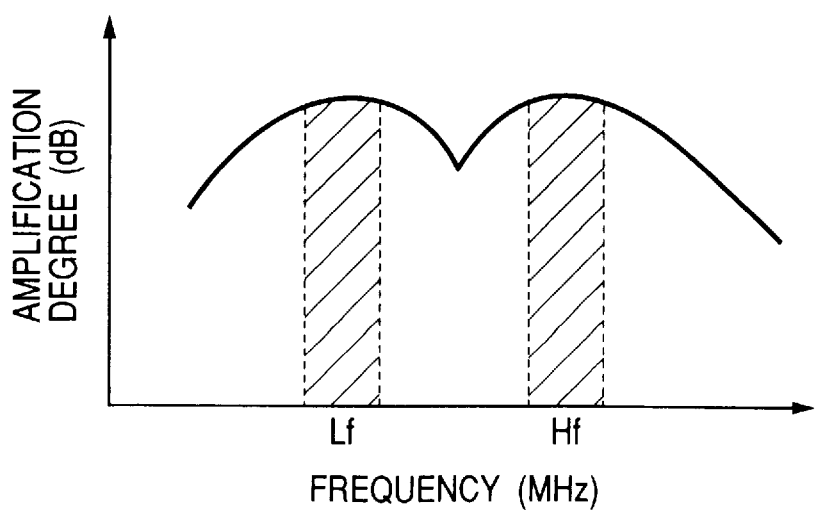
FIG. 2 is an amplifying characteristic diagram of an amplifier in a two-band oscillating apparatus according to the embodiment of the present invention.
Figure 3:
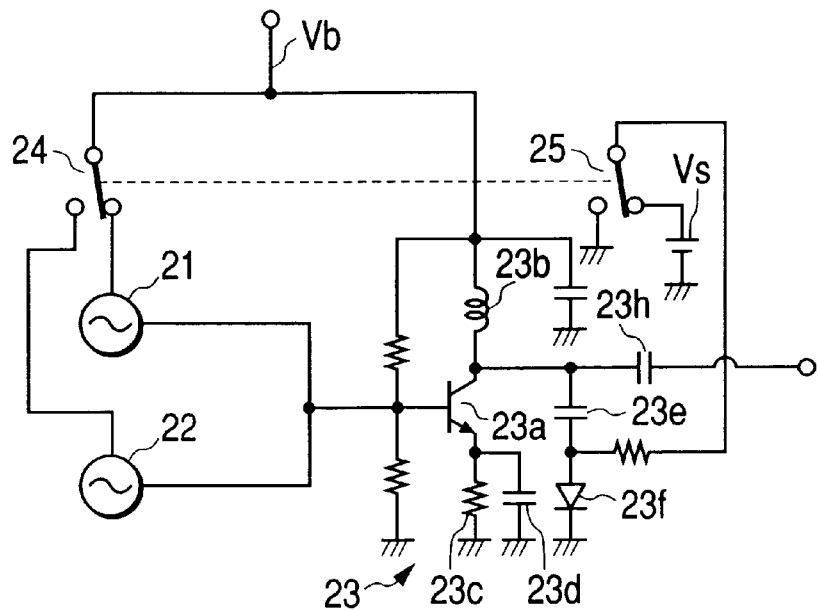
FIG. 3 is a structural diagram of a two-band oscillating apparatus according to the prior of the related art.
Figure 4:
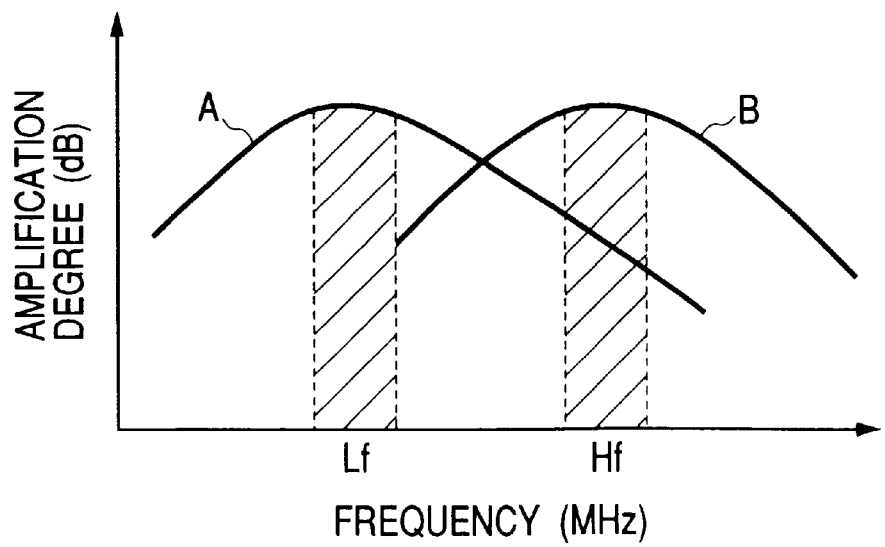
FIG. 4 is an amplifying characteristic diagram of an amplifier in a two-band oscillating apparatus according to the prior art.

As explained above, since the negative feedback is not effective in the first and second frequency bands for the emitter of the amplifying transistor 3a but is effective in the other frequency bands by using the first series resonance means 3d and second series resonance means 3e, the amplification degree of the amplifier 3 is increased up to the almost equal level in the first and second frequency bands but is reduced in the other frequency bands as illustrated in FIG. 2.

When the power source voltage is applied to the collector of the first oscillation transistor 1a through the change-over switch 4, the first oscillator 1 operates to output the oscillation signal of the first frequency band. This output signal is then input to the amplifier 3. In this timing, since the power source voltage is not applied to the collector of the second oscillation transistor 2a, the second oscillator 2 does not operate. The oscillation signal in the first frequency band is amplified to a large extent by the amplifier 3 and it is output from the collector of the amplifying transistor 3a via the DC-cut capacitor 3f.

Meanwhile, when the power source voltage is applied to the collector of the second oscillation transistor 2a through the change-over switch 4, the second oscillator 2 operates to output the oscillation signal of the second frequency band. This output signal is input to the amplifier 3. In this timing, since the power source voltage is not applied to the collector of the first oscillation transistor 1a, the first oscillator 1 does not operate. The oscillation signal of the second frequency band is then amplified to a large extent with the amplifier 3 and this amplified oscillation signal is output from the collector of the amplifying transistor 3a via the DC-cut capacitor 3f.

As explained above, the two-band oscillating apparatus of the present invention is one aspect comprises the first oscillator for outputting an oscillation signal of the first frequency band, the second oscillator for outputting an oscillation signal of the second frequency band higher than the first frequency band and the grounded-emitter type amplifier for amplifying the oscillation signal of the first frequency band or second frequency band. The bias resistor is connected between the emitter of amplifying transistor and the ground. The first series resonance device having the series resonance frequency in the first frequency band, and the second series resonance device having the series resonance frequency in the second frequency band are also connected between the emitter and the ground. The amplifier attains a large amplification degree in the first and second frequency bands with the simplified structure using a less number of parts. Moreover the oscillation signals in the first and second frequency bands can be amplified almost up to the equal level.

In addition, since the two-band oscillating apparatus of the present invention utilizes in one aspect the first capacitance element having the self series resonance frequency in the first frequency band as the first series resonance device and the second capacitance element having the self series resonance frequency in the second frequency band as the second series resonance device, the oscillation signal of the first frequency band and the oscillation signal of the second frequency band can be amplified almost up to the equal level by utilizing only the capacitance elements.

Moreover, the two-band oscillating apparatus of the present invention in one aspect uses the first chip capacitor as the first capacitance element and the second chip capacitor as the second capacitance element and can therefore be reduced in size easily.

Moreover, the two-band oscillating apparatus of the present invention in one aspect structures the first series resonance device with the first capacitance device and the first inductance device, and the second series resonance device with the second capacitance device and the second inductance device. Therefore, respective series resonance frequencies of the first series resonance device and the second series resonance device can be set easily.

Moreover, the two-band oscillating apparatus of the present invention in one aspect comprises the first conductor for connecting the first capacitance device between the emitter and the ground and the second conductor for connecting the second capacitance device between the emitter and the ground, and uses the first conductor as the first inductance device and the second conductor as the second inductance device. Thereby, the number of parts can be reduced.

What is claimed is:

1. A two-band oscillating apparatus comprising: a first oscillator for outputting a first oscillation signal of a first frequency band; a second oscillator for outputting a second oscillation signal of a second frequency band which is higher than the first frequency band; and a grounded-emitter type amplifier including an amplifying transistor, the amplifying transistor to amplify the first oscillation signal of first frequency band and the second oscillation signal of second frequency band, wherein a bias resistor is connected between an emitter of the amplifying transistor and the ground, and wherein a first series resonance means having a first series resonance frequency in the first frequency band and a second series resonance device having a second resonance frequency in the second frequency band are connected between the emitter and the ground.

2. A two-band oscillating apparatus according to claim 1, wherein a first capacitance element having the first series resonance frequency in the first frequency band is used as the first series resonance device, wherein a second capacitance element having the second series resonance frequency in the second frequency band is used as the second series resonance device.

3. A two-band oscillating apparatus according to claim 2, wherein the first capacitance element is used as a first chip capacitor, wherein the second capacitance element is used as a second chip capacitor.

4. A two-band oscillating apparatus according to claim 1, wherein the first series resonance device is structured with the first capacitance device and the first inductance device, wherein the second series resonance device is structured with the second capacitance device and the second inductance device.

5. A two-band oscillating apparatus according to claim 4, wherein a first conductor is provided to connect the first capacitance device between the emitter and ground, a second conductor is provided to connect the second capacitance device between the emitter and ground, and the first conductor is used as the first inductance device, while the second conductor as the second inductance device.

* * * * *